(12) United States Patent
Uesaka

(10) Patent No.: US 8,382,488 B2
(45) Date of Patent: Feb. 26, 2013

(54) COAXIAL CONNECTOR

(75) Inventor: Ryo Uesaka, Ebina (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 13/141,348

(22) PCT Filed: Dec. 21, 2009

(86) PCT No.: PCT/US2009/068912
§ 371 (c)(1),
(2), (4) Date: Sep. 14, 2011

(87) PCT Pub. No.: WO2010/075246
PCT Pub. Date: Jul. 1, 2010

(65) Prior Publication Data
US 2011/0318959 A1 Dec. 29, 2011

(30) Foreign Application Priority Data
Dec. 22, 2008 (JP) .................................. 2008-325714

(51) Int. Cl.
*H01R 13/17* (2006.01)
(52) U.S. Cl. ........................ 439/66; 439/675; 439/581
(58) Field of Classification Search .................. 439/66, 439/675, 63, 581
See application file for complete search history.

(56) References Cited

U.S. PATENT DOCUMENTS

| 3,378,810 | A | * | 4/1968 | Dorrell | 439/436 |
| 3,458,851 | A | * | 7/1969 | Stella | 439/436 |
| 4,743,201 | A | * | 5/1988 | Robinson et al. | 439/10 |
| 5,009,613 | A | * | 4/1991 | Langgard et al. | 439/482 |
| 5,456,621 | A | | 10/1995 | Gan | |
| 5,461,326 | A | * | 10/1995 | Woith et al. | 324/750.25 |

FOREIGN PATENT DOCUMENTS

JP H06-063156 10/1995

OTHER PUBLICATIONS

International Search Report and Written Opinion for PCT Patent Application No. PCT/US2009/068912, dated Mar. 3, 2010.

\* cited by examiner

*Primary Examiner* — Gary F. Paumen
(74) *Attorney, Agent, or Firm* — Timothy M. Morella

(57) ABSTRACT

A coaxial connector 1, which is attached to a circuit board 2 having a land 151, includes a coaxial terminal 51 which has a coaxial structure including a center terminal 52 and a cylindrical outer terminal 61 surrounding the center terminal 52; a housing 11 which accommodates the coaxial terminal 51; and a cylindrical contact 81 which is movable in an axial direction of the outer terminal 61 and which is brought into contact with the land 151; wherein an oblique slit 82 or an oblique groove is formed on the cylindrical contact 81 obliquely with respect to the axial direction; and the coaxial terminal 51 or the housing 11 is provided with a projection (95, etc.) which is engaged with the oblique slit 82 or groove.

4 Claims, 15 Drawing Sheets

Fig. 5
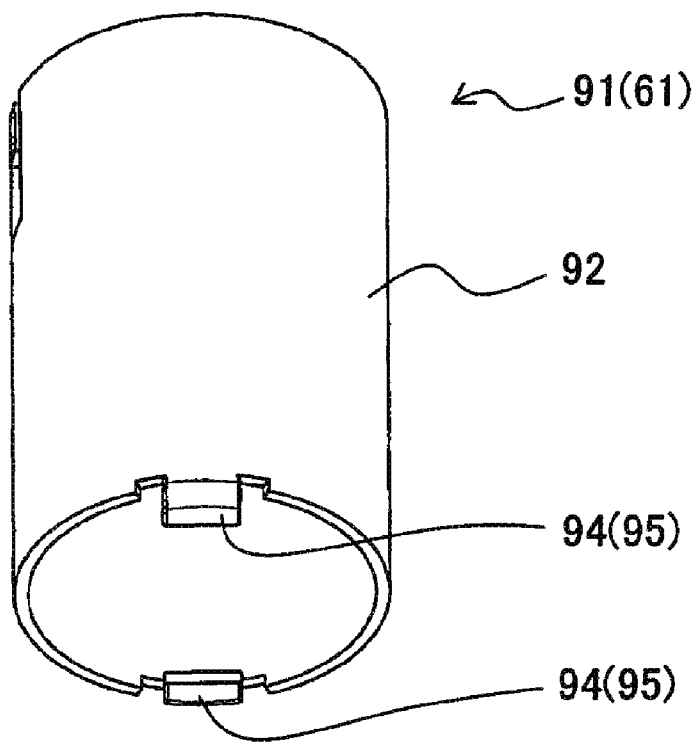
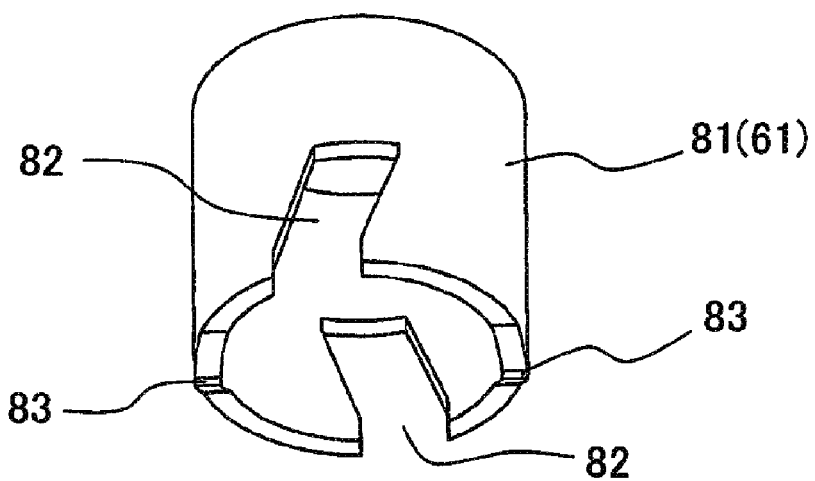

Prior Art

Prior Art

COAXIAL CONNECTOR

CROSS REFERENCE TO RELATED APPLICATION

The present application claims priority from Japanese Patent Application No. 2008-325714, filed on Dec. 22, 2008, the disclosure of which is incorporated herein by reference in its entirety.

FIELD OF THE INVENTION

The present invention relates to a coaxial connector.

DESCRIPTION OF THE RELATED ART

Japanese Utility Model Application Laid-open No. 60-123666 discloses a coaxial movable contact probe 851, as shown in FIG. 14. The coaxial movable contact probe 851 includes a center conductor 852 and an outer conductor 861 having a plain cylindrical shape and surrounding the center conductor 852. As shown in FIG. 15, the probes 851 are held by a movable plate 802 movable relative to a target circuit board 801 on which semiconductors, electronic components, etc. are mounted as targets of measurement. Further, coaxial connectors (hereinafter referred to as "coaxial plugs") 961 are connected to one ends of the probes 851, respectively. Each of the coaxial plugs 961 is connected via a coaxial cable 962 to a measuring circuit board (not shown) on which a signal generator circuit, a comparator, etc. are mounted. At the time of the measurement, the movable plate 802 is moved toward the target circuit board 801 to bring the other ends of the probes 851 into contact with the target circuit board 801. Consequently, the coaxial plugs 961 are electrically connected to the target circuit board 801 by the probes 851, to thereby electrically connect the target circuit board 801 and the measuring circuit board to each other.

By using the coaxial probes 851, a high-frequency component of a signal is hardly attenuated or reflected in the probes. Accordingly, an input signal outputted by the signal generator circuit in the measuring circuit board is transmitted or transferred to the target circuit board 801 via the probes 851 as maintaining its waveform satisfactorily. Further, an output signal outputted by a target of the measurement (measurement target) in the target circuit board 801 is transmitted to the measuring circuit board via the probes 851 while maintaining its waveform satisfactorily.

However, the coaxial movable contact probes 851 of Japanese Utility Model Application Laid-open No. 60-123666 are press-fit in cavities 814 formed in the movable plate 802; and the movable plate 802 is moved toward the target circuit board 801 to thereby move the coaxial movable contact probes 851 upwardly and downwardly so that the probes 851 are brought into contact with the target circuit board 801. As described above, the coaxial movable contact probes 851 are merely in pressure contact with the target circuit board 801 from below. Therefore, for example, in a case that oxide film, etc. is formed on a surface of a land of the target circuit board 801, there is a fear that the connection reliability is greatly lowered due to the oxide film, which in turn makes any accurate measurement to be difficult.

Japanese Patent Application Laid-open No. 7-272810 discloses a movable contact pin device. A measurement target is mounted on the movable contact pin device. At the time of the mounting, a contact member, of the movable contact pin device, which construct the movable contact pin device is brought into pressurized contact with a connection terminal of the measurement target, and then the contact member is rotated by another twisted member constructing the movable contact pin device. In such a manner, the contact member is rotated in a state that the contact member is in contact with the connection terminal to thereby perform wiping. By doing so, it is possible to rub off or remove the oxide film, etc. from the surfaces of the connection terminal and the contact member, making it possible to improve the connection reliability.

In the contact rotation mechanism of Japanese Patent Application Laid-open No. 7-272810, however, the contact member is rotated by using the another twisted constructing member which constructs the movable contact pin device. Therefore, it is necessary to arrange the another twisted constructing member at the position of the rotation axis of the contact member. Therefore, in a case that an attempt is made to rotate the outer conductor 861 in the coaxial movable contact probe 851 disclosed in Japanese Utility Model Application Laid-open No. 60-123666, it is necessary to arrange the another twisted constructing member at a position of the rotation axis of the outer conductor 861. In the coaxial movable contact probe 851, however, the center conductor 852 needs to be arranged at the center of the outer conductor 861. Thus, in the coaxial movable contact probe 851 disclosed in Japanese Utility Model Application Laid-open No. 60-123666, even if the attempt were made to arrange the another twisted constructing member, disclosed in Japanese Patent Application Laid-open No. 7-272810, at the position of the rotation axis of the outer conductor 861, it is not possible to arrange the another twisted constructing member disclosed in Japanese Patent Application Laid-open No. 7-272810 at the position of the rotation axis since the center conductor 852 is already arranged at the position. As a result, in the coaxial movable contact probe 851, it is not possible to rotate the outer conductor 861 by using the another twisted constructing member in order to perform the wiping, which in turn greatly lowers the connection reliability of the coaxial movable contact probe 851.

SUMMARY OF THE INVENTION

An object of the present invention is to provide a coaxial connector capable of wiping terminals and a land of a circuit board, in the terminals having coaxial structure.

According to the present invention, there is provided a coaxial connector 1 which is attached to a circuit board 2 having a land 151, the coaxial connector 1 including: a coaxial terminal 51 which has a coaxial structure including a center terminal 52 and a cylindrical outer terminal 61 surrounding the center terminal 52; a housing 11 which accommodates the coaxial terminal 51; and a cylindrical contact 81 which is movable in an axial direction of the outer terminal 61 and which is brought into contact with the land 151; wherein an oblique slit or groove 82 is formed on the cylindrical contact 81 obliquely with respect to the axial direction; and the coaxial terminal 51 or the housing 11 is provided with a projection (95, etc.) which is engaged with the oblique slit or groove 82. In the present application, the term "land" means a contact point, which is provided on the circuit board, at which the connector is brought into contact with the circuit board and which has any shape. The land may include, for example, a pad, etc.

In the present invention, since the cylindrical contact 81 which is brought into contact with the land 151 of the circuit board 2 is movable in the axial direction of the outer terminal 61, it is possible to make a projection amount of the cylindrical contact 81 from the housing 11 to be variable. In addition, the cylindrical contact 81 has the oblique slit or groove 82 formed therein, and the projection (95, etc.) formed on the coaxial terminal 51 or the housing 11 is engaged with the oblique slit or groove 82. Therefore, when the housing 11 is pressed toward (against) the circuit board 2 in order to attach the coaxial connector 1 to the circuit board 2, the cylindrical contact 81 is brought into contact with the land 151 of the circuit board 2, and then is made to rotate around the axis of the outer terminal 61 while being pushed into the housing 11. By the rotation of the cylindrical contact 81 brought in contact with the land 151 of the circuit board 2, a contact portion of the cylindrical contact 81 and a contact portion of the land 151 are rubbed against each other, thereby performing the wiping. Further, with this wiping, it is possible to rub off or remove an oxide film from the surface of the cylindrical contact 81 and the surface of the land 151 of the circuit board 2 and to remove dust or dirt which has been caught between the cylindrical contact 81 and the circuit board 2, thereby making it possible to suppress the increase in contact resistance between the cylindrical contact 81 and the circuit board 2.

Moreover, since the projection (95, etc.) which is engaged with the oblique slit or groove 82 so as to rotate the cylindrical contact 81 can be formed in, for example, the housing 11 or the like, it is possible to arrange the center terminal 52 coaxial with the outer terminal 61. Therefore, in the present invention, the wiping can be performed even in the terminal having the coaxial structure.

In the present invention, the coaxial connector 1 may further include a biasing member 71 which biases the cylindrical contact 81 so that the cylindrical contact 81 projects from the housing 11. The biasing member 71 may be any member which is resiliently deformable, including, for example, a coil spring, a leaf spring, etc. By using the biasing member 71 biasing the cylindrical contact 81, it is ensured that in the housing 11 before attached to the circuit board 2, the cylindrical contact 81 projects from the housing 11, thereby making it possible to bring the cylindrical contact 81 which is in a projecting state into contact with the land 151 of the circuit board 2 before the housing 11 is attached to the circuit board 2. Further, since a force generated by the biasing member 71 constantly acts on the cylindrical contact 81, the cylindrical contact 81 contacting with the land 151 of the circuit board 2 can be rotated, while maintaining its contacting state with the land 151, during operation for attaching the housing 11 to the circuit board 2. This makes it possible to perform the wiping of the land 151 in assured manner.

Moreover, since the biasing force between the cylindrical contact 81 and the land 151 is increased by the biasing member 71, it is possible to perform the wiping under an appropriate biasing force and further to prevent the land 151 and the cylindrical contact 81 from being damaged by any excessively high biasing force. Therefore, it is possible to prevent the occurrence of inconvenience or problem such as a damage or the like of the land 151 which would otherwise occur in such a case that the cylindrical contact 81 is biased toward the land 151 with an excessively high biasing force.

Further, the biasing member 71 keeps biasing the cylindrical contact 81 against the land 151 even after the coaxial connector 1 is attached to the circuit board 2. Therefore, the cylindrical contact 81 and the land 151 are brought into tight contact with each other, thereby making it possible to reduce the contact resistance therebetween.

In the present invention, the cylindrical contact 81 may have a plurality of projecting contact points 83 which are arranged on the cylindrical contact 81 at rotationally symmetric positions of a cylindrical shape of the cylindrical contact to project from the cylindrical contact and which are brought into contact with the land 151. When the plurality of projecting contact points 83 are provided on the cylindrical contact 81, the cylindrical contact 81 is brought into contact with the lands 151 at the plurality of projecting contact points 83. Therefore, the projecting contact points 83 can be brought into contact with the land 151 in assured manner, thereby making it possible to perform the wiping for the land 151 with the projecting contact points 83. Further, it is enough that the land 151 formed on the circuit board 2 is formed at a range in which the plurality of projecting contact points 83 perform the wiping, which in turn eliminate the necessity to form, for example, a doughnut-shaped land corresponding to the cylindrical shape of the cylindrical contact 81. Furthermore, in the cylindrical contact 81 formed to have the cylindrical shape, portions other than the projecting contact points 83 are not brought into contact with the circuit board 2. Therefore, it is possible to prevent the cylindrical contact 81 from erroneously wiping portions of the circuit board 2 which are other than the lands 151, even without forming the land 151 entirely at a portion of the circuit board 2 overlapping with the cylindrical contact 81.

In the present invention, the oblique slit 82 may be formed in the cylindrical contact 81; and the coaxial connector 1 may further include: a conductive cover 91 having a conductive cover-body 92 which is formed in a cylindrical shape and into which the cylindrical contact 81 is inserted; and a conductive arm 94 which projects from the conductive cover-body 92 and which is bent inwardly and functions as the projection (95, etc.) when the conductive arm 94 is engaged with the oblique slit 82.

By forming the oblique slit 82 in the cylindrical contact 81 and causing the projection (95, etc.) to engage with the oblique slit 82, the projection (95, etc.) and the oblique slit 82 can be engaged with each other more firmly or strongly than in a case that the oblique groove 82 is formed in the cylindrical contact 81 and the projection (95, etc.) is made to engaged with the oblique groove 82. For example, in a case that the cylindrical contact 81 (outer terminal 61) has a diameter of about 2 mm and is formed of a rounded thin metal plate, it is not possible to form any oblique groove 82 sufficiently deeply in the cylindrical contact 81, and thus in the engagement realized with combination of the oblique groove 82 and the projection (95, etc.) it is not possible to obtain any sufficient engagement depth, with a possibility that the projection (95, etc.) might come off or disengage from the oblique groove 82. On the other hand, in the engagement realized by combination of the oblique slit 82 and the projection (95, etc.), the projection (95, etc.) can be made to engage deeply so as to reach a deeper portion, inside the cylindrical contact 81, beyond the oblique slit 82, thereby making it possible to achieve the engagement with sufficient engagement depth.

Moreover, in the state that the coaxial connector 1 is attached to the circuit board 2, the oblique slit 82 is covered by the conductive cover 91 (conductive cover-body 92 and the conductive arm 94). In addition, since the conductive cover 92 and the cylindrical contact 81 are electrically connected to each other due to the engagement between the oblique slit 82 and the projection (95, etc.), an opening formed by the result of formation of the oblique slit 82 can be shielded by the conductive cover 91 having an electric potential same as that of the cylindrical contact 81. As a result, the outer terminal 61 can be brought into a state that the outer terminal 61 does not have any electrical opening due to the formation of the oblique slit 82, although the outer terminal physically has the opening due to the formation of the oblique slit 82. As described above, in the present invention, it is possible to rotate the cylindrical contact 81 in assured manner owing to the sufficient engagement depth, without lowering the shielding effect of the outer terminal 61. In the biased state necessary for the wiping, it is possible to rotate the cylindrical contact 81 with a strong force.

As described above, according to the coaxial connector of the present invention, it is possible to perform the wiping of the terminal and the land of the circuit board, in the terminal having the coaxial structure.

BRIEF DESCRIPTION OF THE DRAWINGS

FIG. 5 is an exploded view of other portions of the coaxial terminal shown in FIG. 3;

DETAILED DESCRIPTION OF THE PREFERRED EMBODIMENTS

In the following, an explanation will be give about an embodiment of a coaxial connector of the present invention with reference to the drawings. It should be noted that the embodiment described below is an example of a preferred embodiment of the present invention and is not intended to limit the present invention.

Figure 1:
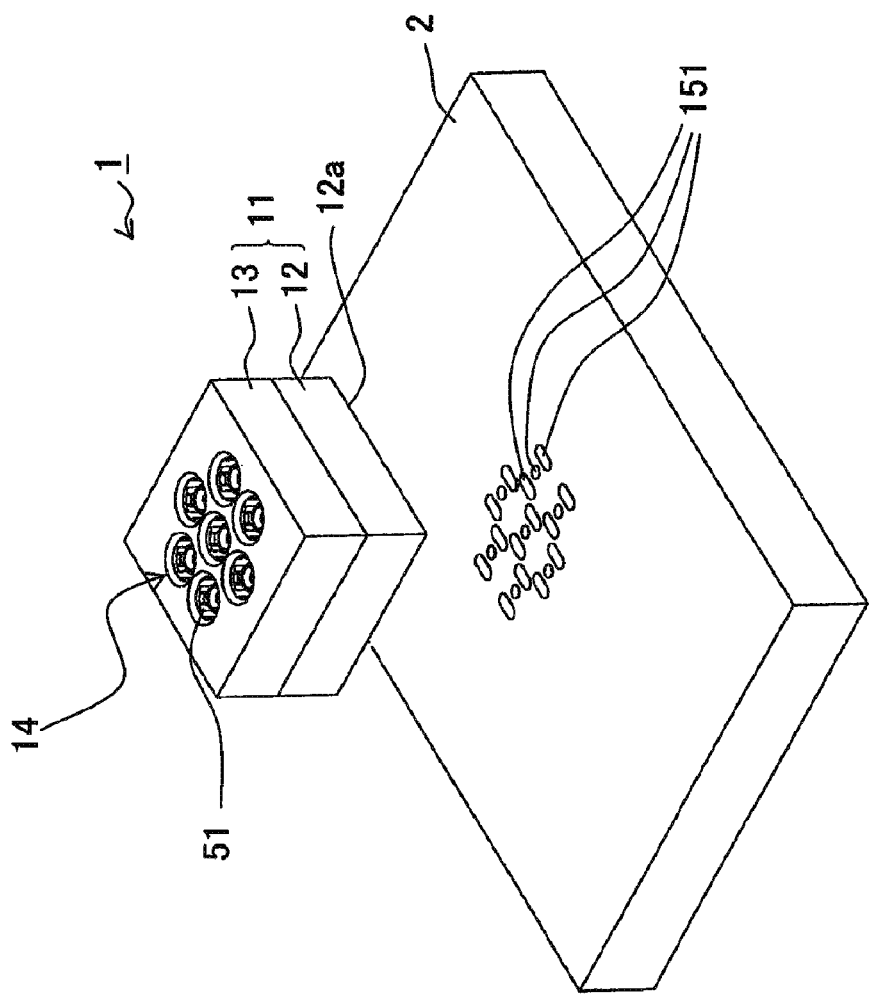
FIG. 1 is a perspective view of a connector of an embodiment of the present invention and a circuit board.

FIG. 1 is a perspective view of a connector 1 of the embodiment seen from obliquely above. FIG. 1 also shows a circuit board 2 to which the connector 1 is to be attached. The connector 1 has a housing 11 which is formed in a plate shape, that is long in one direction, with an insulating material such as resin; a plurality of cavities 14 penetrating through the housing 11 in an up and down direction; and a plurality of coaxial terminals 51 each of which has a coaxial structure including a center terminal 52 and an outer terminal 61 and which are accommodated in the cavities 14, respectively.

As shown in FIG. 1, a plurality of lands 151 are formed in the circuit board 2. Electric wirings such as through holes (not shown) are connected to the lands 151.

Figure 8:
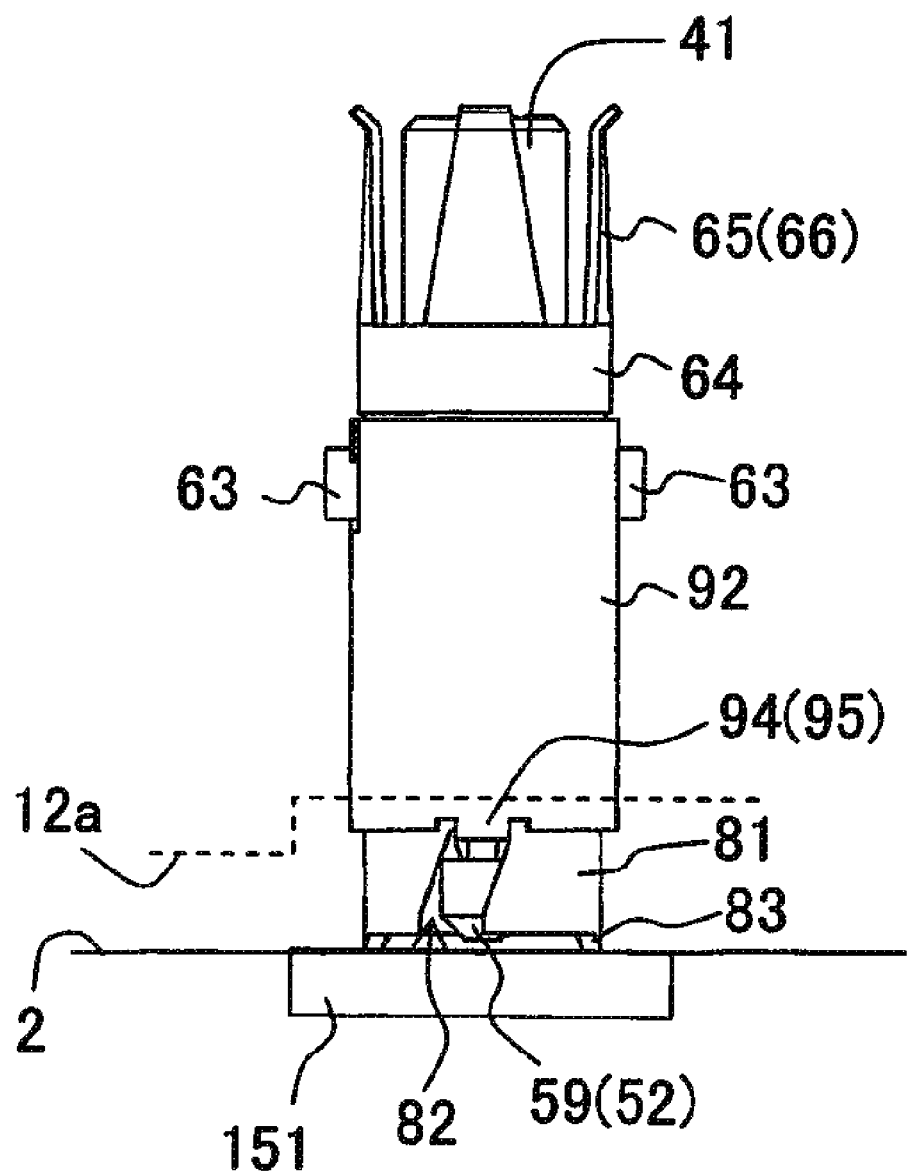
FIG. 8 is an explanatory view showing a state that the coaxial terminal in FIG. 1 is made to abut on the circuit board.
Figure 9:
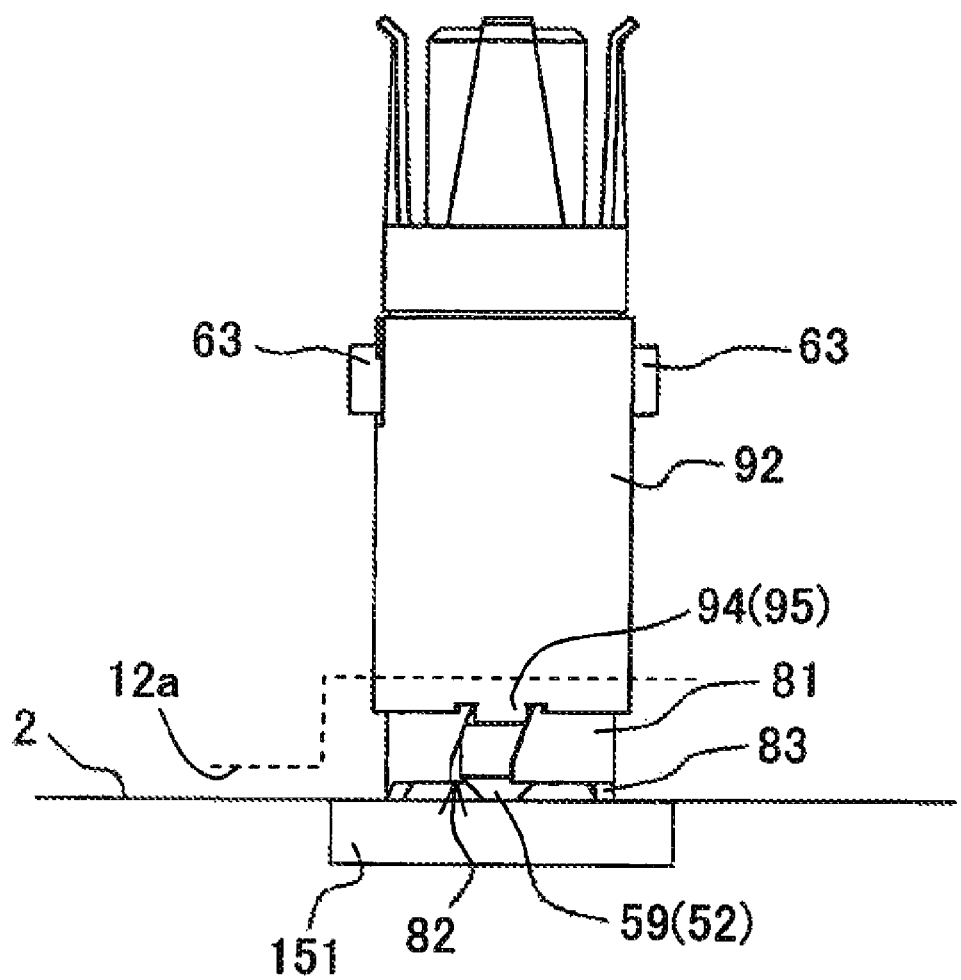
FIG. 9 is an explanatory view showing a state that a housing is pressed toward (against) the circuit board from the state in FIG. 8.
Figure 10:
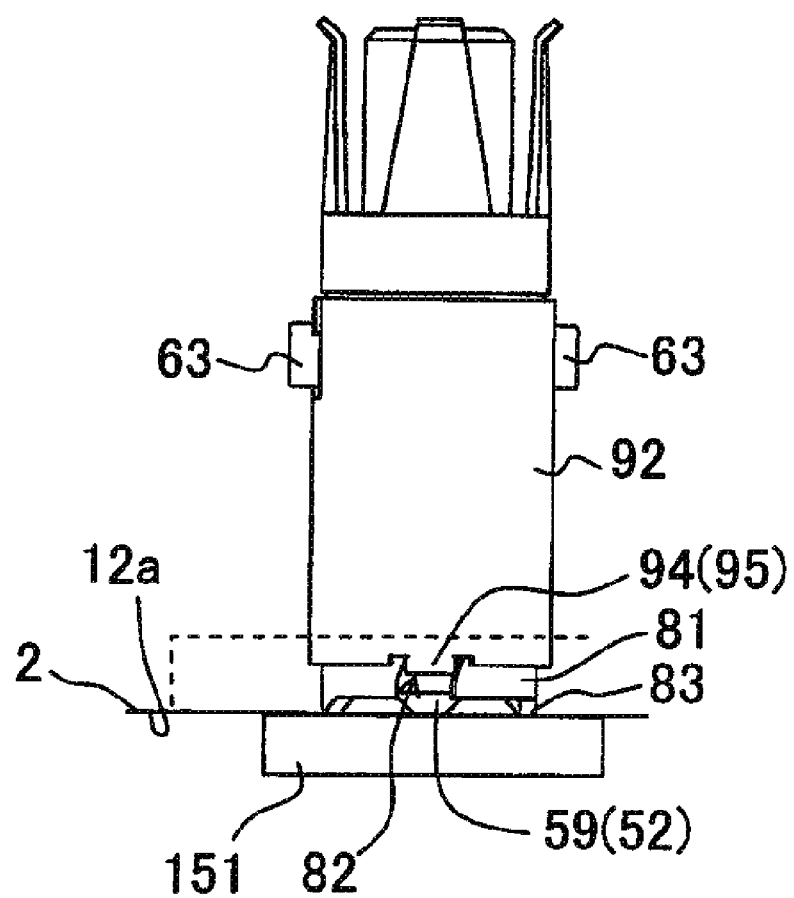
FIG. 10 is an explanatory view showing a state that the coaxial terminal is attached to the circuit board.

As shown in FIGS. 8 to 10 (which will be descried later on), the connector 1 is attached to the circuit board 2 at a lower surface 12a of the housing 11. Further, in each of the coaxial terminals 51, the center terminal 52 and the outer terminal 61 projecting downward from the housing 11 are brought into contact with and electrically connected to three pieces of the land 151, the lands 151 being aligned on the circuit board 2 such that land rows are each formed of three pieces of the land 151.

Figure 2:
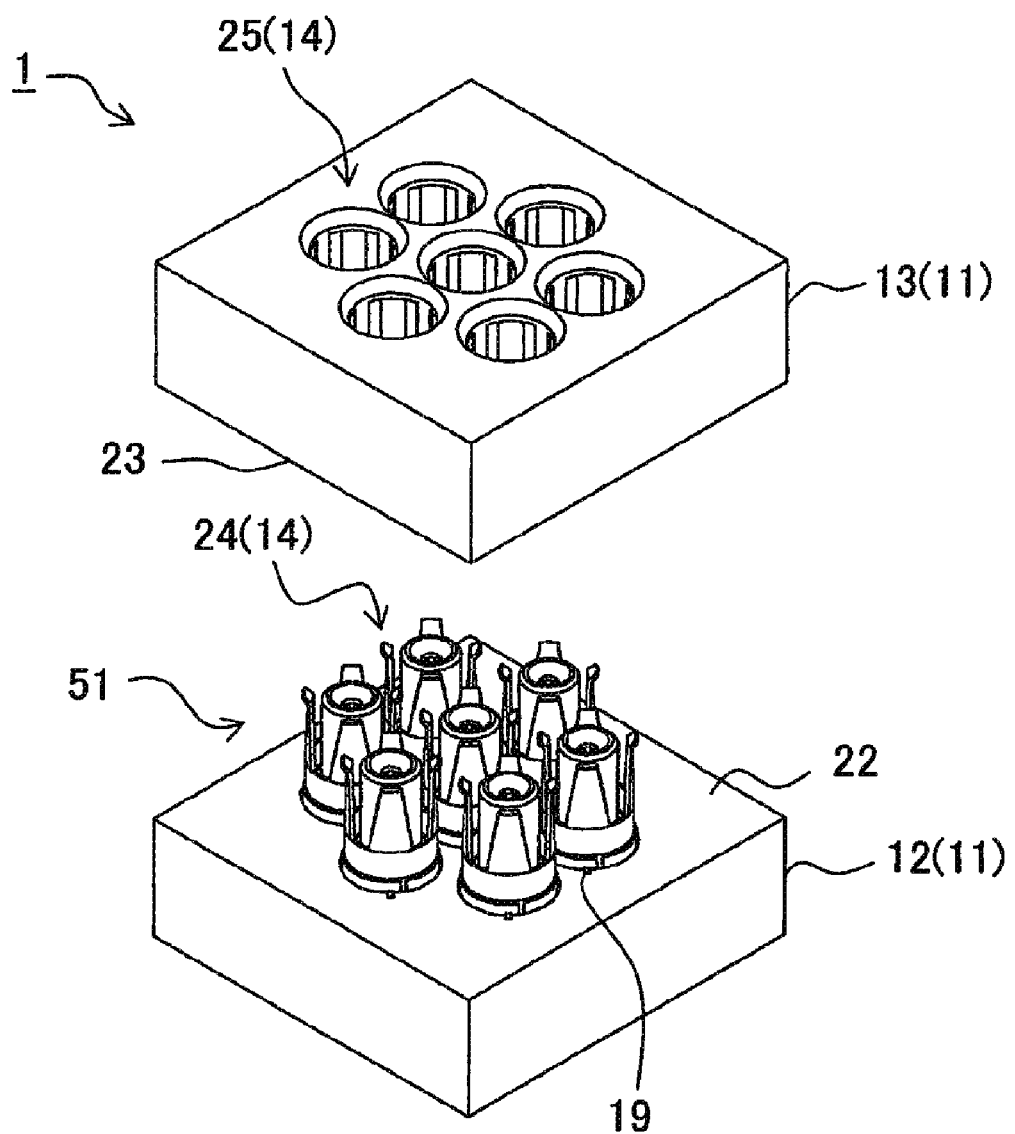
FIG. 2 is an exploded perspective view of the connector shown in FIG. 1.

FIG. 2 is an exploded perspective view of the housing 11. The housing 11 is vertically divided into two parts by a plane extending in right to left to be parallel to the circuit board 2 and thereby includes a lower housing 12 and an upper housing 13. The lower housing 12 is positioned under the upper housing 13 in FIG. 1 and is directly attached to the circuit board 2; and a lower surface 23 of the upper housing 13 and an upper surface 22 of the lower housing 12 are in contact with each other. Further, the plurality of cavities 14 are formed in the housing 11. Each of the cavities 14 is constructed of a lower cavity 24 formed in the lower housing 12 and an upper cavity 25 formed in the upper housing 13.

Figure 3:
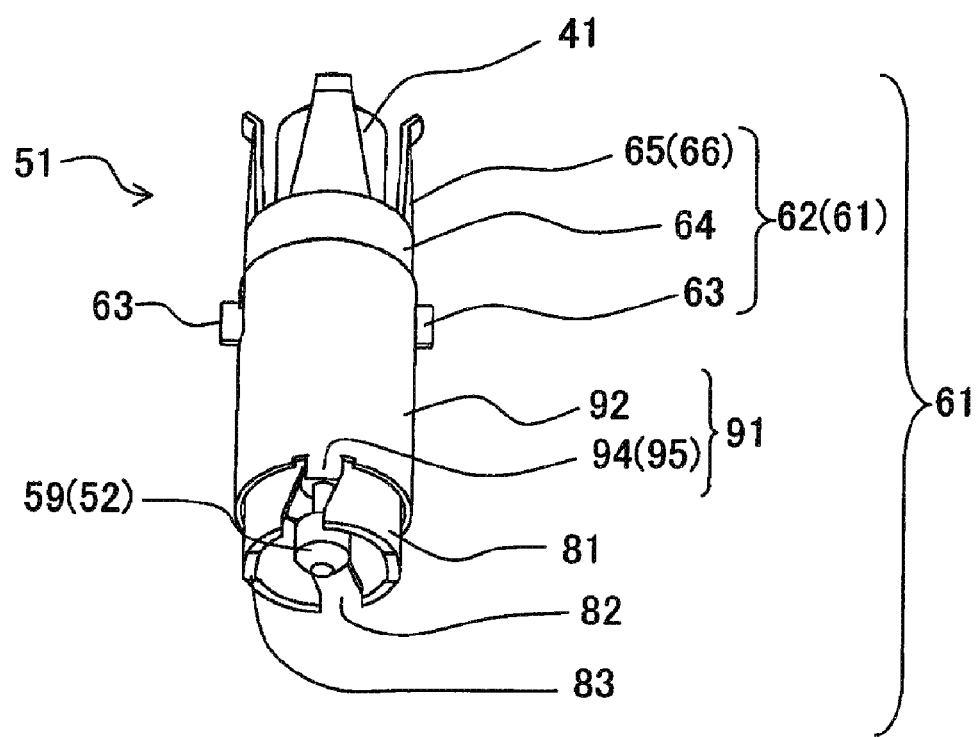
FIG. 3 is a perspective view of a coaxial terminal shown in FIG. 1.
Figure 4:
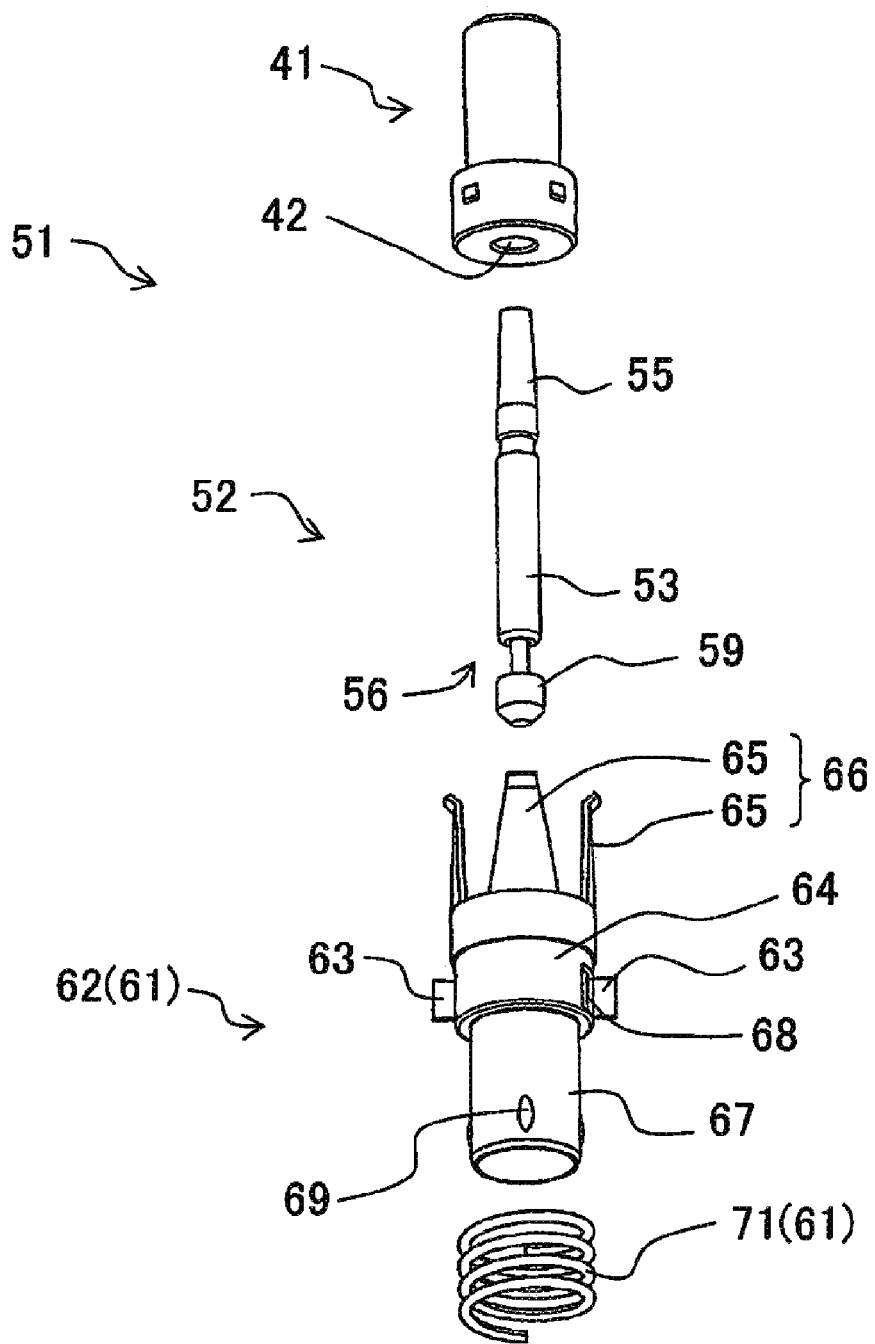
FIG. 4 is an exploded view of portions the coaxial terminal shown in FIG. 3.

FIG. 3 is a perspective view of the coaxial terminal 51 which is accommodated in the cavity 14. FIGS. 4 and 5 are each an exploded view of the coaxial terminal 51.

Figure 12:
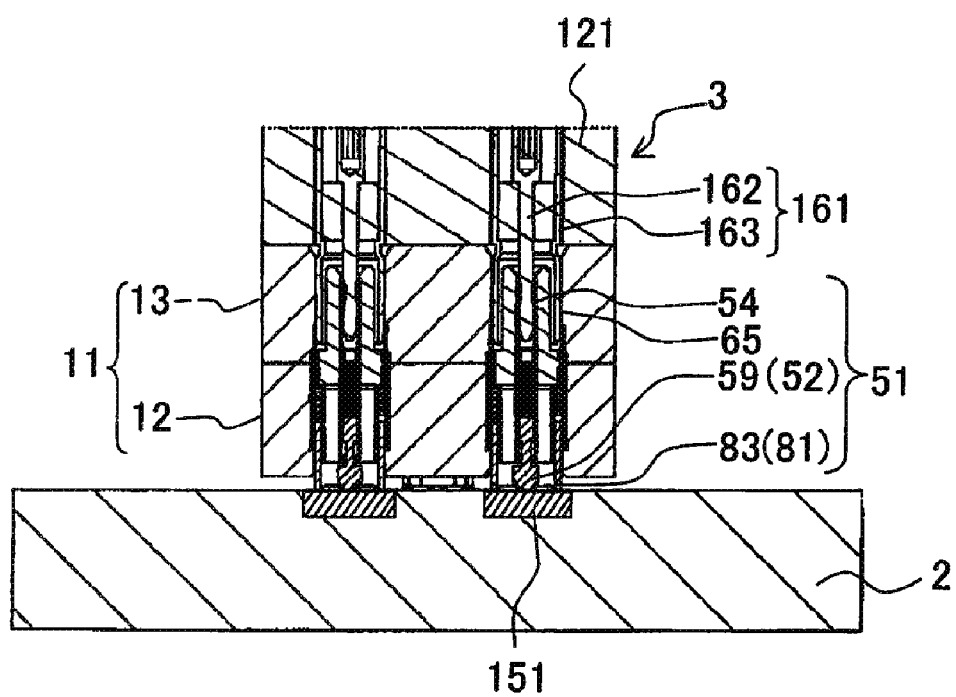
FIG. 12 is a cross-sectional view showing a state that the holder shown in FIG. 11 is connected to the connector.

Each of the coaxial terminals 51 includes the center terminal 52, the outer terminal 61, and an insulator 41 via which the outer terminal 61 holds the center terminal 52 in an insulated state; and each of the coaxial terminals 51 is accommodated in one of the cavities 14 formed in the housing 11 as shown in FIG. 2. The center terminal 52 is mated with an axial terminal 162 of a coaxial plug 161 as shown in FIG. 12 (to be described later); and the outer terminal 61 is mated with a surrounding terminal 163 of the coaxial plug 161.

As shown in FIG. 4, the center terminal 52 includes a center conductor 53, a center coil spring (not shown), and a shaft-shaped contact 59 each of which is formed by using a conductive material. The center conductor 53 has a substantially shaft shape and has, on the upper portion thereof, a mating portion 55 holding or sandwiching the axial terminal 162 of the coaxial plug 161. Further, a center hole 56 is formed in the lower surface of the center conductor 53 having the shaft shape; and the center coil spring and one end of the shaft-shaped contact 59 are inserted in the center hole 56.

As shown in FIG. 4, the insulator 41 has a cylindrical shape and includes a large-diameter portion and a small-diameter portion which are coaxial. A center hole 42 is formed at the center of the cylindrical insulator 41, and the center terminal 52 is inserted in the center hole 42.

As shown in FIGS. 4 and 5, the outer terminal 61 includes an outer conductor 62, an outer coil spring 71, a cylindrical contact 81, and a conductive cover 91 each of which is formed by using a conductive material such as a metal plate. The outer conductor 62 has a substantially cylindrical shape as a whole and includes a body portion 64 having a pair of anchors 63 projecting or protruding from the surface (outer surface) of the body portion 64; a mating portion 66 formed above the body portion 64; and a thin cylinder portion 67 which is formed to be located below the body portion 64. The mating portion 66 is constructed of four leaf springs 65 which hold the surrounding terminal 163 of the coaxial plug 161. The thin cylinder portion 67 is formed to be thinner than the body portion 64 and is inserted in the outer coil spring 71 and the cylindrical contact 81. Further, four conductive projections 69 are formed on the outer surface of the thin cylinder portion 67 to project from the outer surface, and the four conductive projections 69 come into contact with the inner surface of the cylindrical contact 81 so that the conductive projections 69 are frictionally movable with respect to the inner surface of the cylindrical contact 81. Therefore, the outer conductor 62 and the cylindrical contact 81 are in direct contact with each other to be electrically connected to each other. Even in a case that the cylindrical contact 81 is inclined relative to the outer conductor 62, the cylindrical contact 81 can move smoothly without the upper end of the cylindrical contact 81 abutting against the outer conductor 62. Further, with the conductive projections 69, the thin cylinder portion 67 (the outer conductor 62) and the cylindrical contact 81 are electrically connected always and directly to each other and thus the electrical connection therebetween can be stable.

As shown in FIG. 5, the cylindrical contact 81 is formed to have a cylindrical shape into which the thin cylinder portion 67 can be inserted and is movable in the axial direction of the outer terminal 61. Further, two oblique slits 82 and two projecting contact points 83 are formed in the cylindrical contact 81. The oblique slits 82 are formed on the outer surface (outer cylindrical surface) of the cylinder of the cylindrical contact 81 having the cylindrical shape, to be oblique with respect to the axial direction of the cylinder. Note that in this embodiment, although two oblique slits 82 are formed, any appropriate design change may be made. However, in a case that the plurality of oblique slits 82 are formed, it is desirable that the oblique slits 82 are arranged, on the outer surface of the cylindrical contact 81, to be rotationally symmetric with each other (that is, arranged at an interval of 180 degrees with respect to each other). This is because when the oblique slits 82 and conductive arms 94 (to be described later) are engaged at two positions, the outer terminal 61 can be moved stably in the axial direction. The projecting contact points 83 are formed so as to project from a lower end of the cylinder and arranged on the outer surface of the cylindrical contact 81 to be rotationally symmetric with each other (that is, arranged at an interval of 180 degrees).

As shown in FIG. 5, the conductive cover 91 has a cylindrical conductive cover-body 92 and a plurality of conductive arms 94 projecting from the conductive cover-body 92. The cylindrical contact 81, the outer coil spring 71 and the body portion 64 are inserted in the cylindrical conductive cover-body 92. The cylindrical contact 81 and the body portion 64 are covered by the conductive cover-body 92. For example, since the outer conductor 62 has an extremely thin diameter that is about 2 mm, each of the anchors 63 is formed on the outer conductor 62 by a press-working process (machining process) performed for the outer conductor 62; and thus as the results of machine-working to form the anchors 63, machining holes 68 are consequently formed in the outer conductor 62 at positions adjacent to the anchors 63 respectively. Even in such a case, it is possible to cover the machining holes 68 with the conductive cover-body 92, thereby making it possible to prevent the irradiation (leakage) of signal from the machining holes 68.

Then, the center terminal 52 is inserted in the center hole 42 of the insulator 41, and the insulator 41 is inserted in the outer conductor 62, whereby the coaxial terminal 51 shown in FIG. 3 is formed. The insulator 41 holds the center terminal 52 coaxially with the outer terminal 61.

Figure 6:
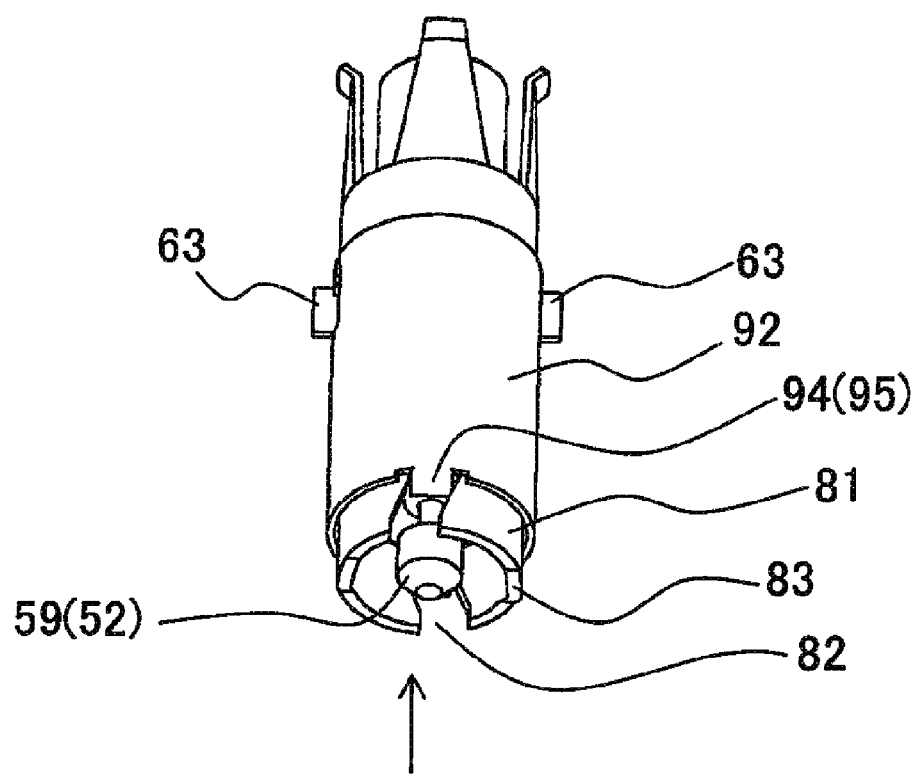
FIG. 6 is a perspective view showing a state that a cylindrical contact and a shaft-shaped contact are further pushed, from the state shown in FIG. 3.
Figure 7:
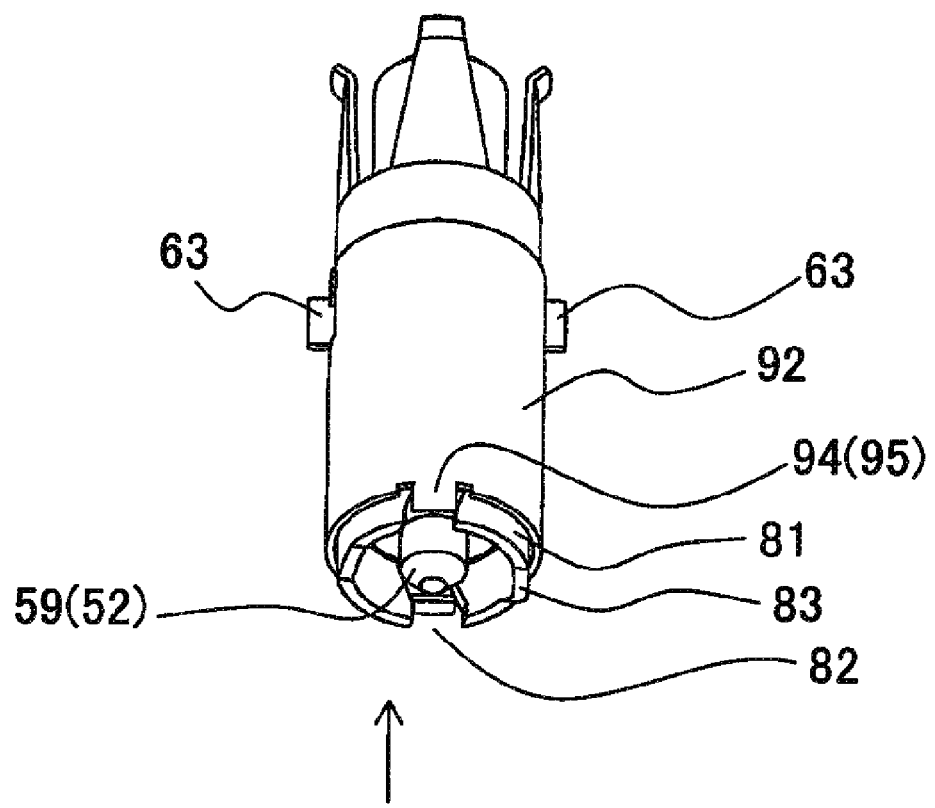
FIG. 7 is a perspective view showing a state that the cylindrical contact and the shaft-shaped contact are further pushed, from the state shown in FIG. 6.

As shown in FIG. 3, the oblique slits 82 are formed on the outer surface of the cylindrical contact 81 to be oblique with respect to the axial direction of the cylinder, and the oblique slits 82 are mated with guide projections 95, respectively, which are projecting from the conductive cover-body 92 and each of which has a free end bent inwardly. Therefore, when the cylindrical contact 81 is moved in the axial direction of the outer terminal 61 as shown in FIGS. 6 and 7, the cylindrical contact 81 rotates (is rotated) within a range in which each of the conductive arms 94 can move in one of the oblique slits 82. As a result, a rotation range of the two projecting contact points 83 of the cylindrical contact 81 is limited within a predetermined range, bringing the projecting contact points 83 into electrical contact with the lands 151 of the circuit board 2, without the projecting contact points 83 deviating out of the lands 151 in the circuit board 2.

Further, although a downward biasing force by the outer coil spring 71 acts on the cylindrical contact 81, the oblique slits 82 are formed in the outer surface of the cylindrical contact 81 to extend from the lower end portion up to a portion in the vicinity of the center in the outer surface of the cylindrical contact. Accordingly, each of the guide projections 95 abuts against the cylindrical contact 81 at the upper end of one of the oblique slits 82 as shown in FIG. 3, and thus the cylindrical contact 81 do not fall off since being held by the conductive arms 94.

As shown in FIG. 2, the anchors 63 of the coaxial terminals 51, in each of which the center terminal 52 and the outer terminal 61 are coaxially arranged, are press-fit in slits 19, respectively, of the lower housing 12. With this, the coaxial terminals 51 are fixed to the lower housing 12. Further, by placing the upper housing 13 from above on the coaxial terminals 51, the coaxial terminals 51 are accommodated in the cavities 14, respectively, of the housing 11, thereby completing the connector 1 shown in FIG. 1.

In this state, each of the center terminals 52 is located at the center of one of the cavities 14 in the axial direction of the cavity 14. Further, as shown in FIG. 8 (to be described later), the other end (lower end) of each of the shaft-shaped contacts 59 projects from the lower surface 12a of the lower housing 12. The shaft-shaped contact 59 projecting from the lower housing 12 is brought into contact with the land 151 of the circuit board 2 shown in FIG. 1. Furthermore, the lower end of the cylindrical contact 81 projects from the lower surface 12a of the lower housing 12. The two projecting contact points 83 of the cylindrical contact 81 projecting from the lower surface 12a of the lower housing 12 are brought into contact with the lands 151 of the circuit board 2 shown in FIG. 1.

FIGS. 8 to 10 are each an explanatory view showing the connector 1 of this embodiment and the circuit board 2. FIG. 8 is an explanatory view of a state that the connector 1 is brought into contact with the circuit board 2; FIG. 9 is an explanatory view showing a process in which the housing 11 is being pressed toward or against the circuit board 2; and FIG. 10 is an explanatory view of a state that the connector 1 is attached to the circuit board 2. Note that in these drawings, the lower surface 12a of the housing 11 is shown by a dotted line.

As shown in FIG. 8, in the connector 1 before being attached to the circuit board 2, the cylindrical contact 81 of the coaxial terminal 51 is pressed downward by the outer coil spring 71 and projects from (projects up to a position lower than) the lower surface 12a (attachment-surface to be attached to the circuit board 2) of the lower housing 12. Further, the shaft-shaped contact 59 is pressed downward by the center coil spring and projects from the lower surface 12a of the lower housing 12.

Upon attaching the connector 1 to the circuit board 2, the pair of projecting contact points 83 of the cylindrical contact 81 are first brought into contact with the lands 151 of the circuit board 2, as shown in FIG. 8. Afterwards, the housing 11 is pressed against the circuit board 2. Consequently, as shown in FIG. 9, the cylindrical contact 81 pressed downward by the outer coil spring 71 is pushed into the housing 11, resisting against the biasing force of the outer coil spring 71, while being kept biased against the lands 151. Further, the shaft-shaped contact 59 pressed downward by the center coil spring is pushed into the housing 11, resisting against the biasing force of the center coil spring, while being kept biased against the land 151.

Since the guide projections 95 of the conductive arms 94 are engaged with the oblique slits 82 of the cylindrical contact 81, the cylindrical contact 81 is rotated around the axis of the outer terminal 61 when pushed into the housing 11. In FIG. 9, the cylindrical contact 81 is rotated in the right direction. By the rotation of the cylindrical contact 81 while the cylindrical contact 81 is kept biased against lands 151, the pair of projecting contact points 83 rub against surfaces of the lands 151. This makes it possible to rub off or remove an oxide film from the surfaces of the pair of projecting contact points 83 and of the lands 151 and to remove dust or dirt which has been caught between the projecting contact points 83 and the lands 151.

Then, as shown in FIG. 10, the lower surface (the lower surface 12a in FIG. 2) of the housing 11 abuts against the circuit board 2. Thus, the connector 1 is attached to the circuit board 2.

Figure 11:
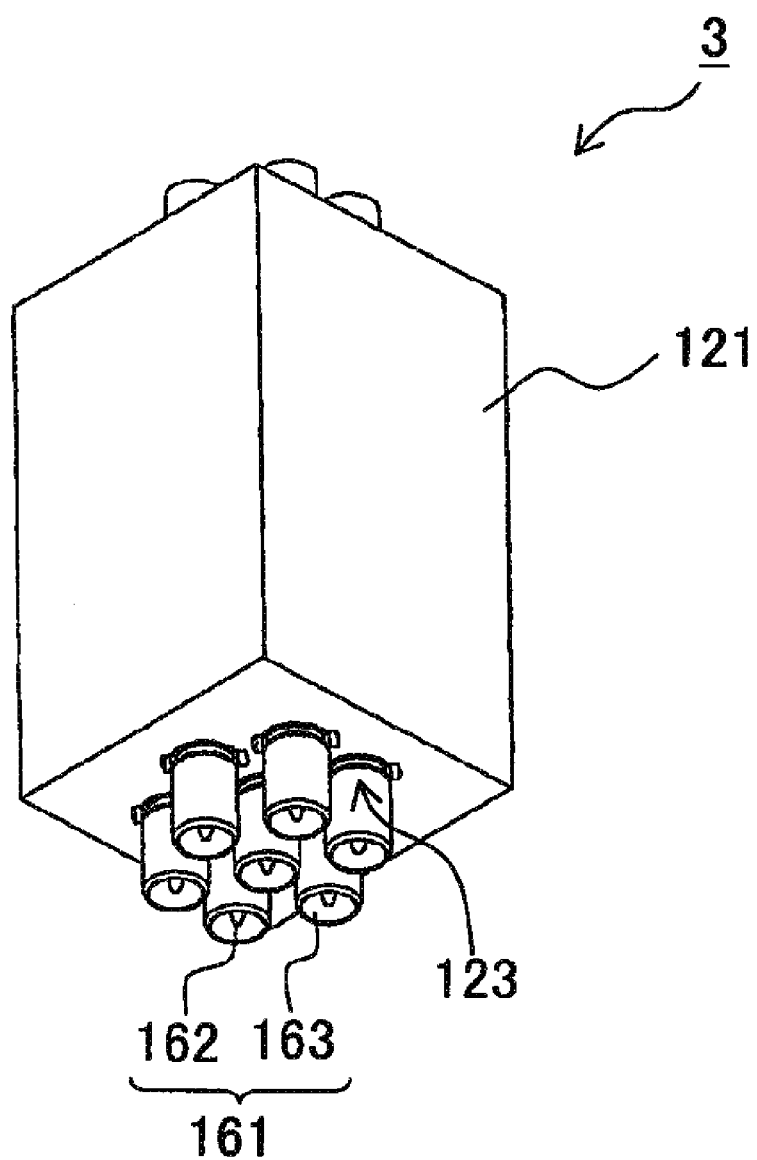
FIG. 11 is a perspective view of a holder which is to be connected to the connector in FIG. 1.

FIG. 11 is a perspective view of a plug 3 which is to be attached to the connector 1 of this embodiment. The plug 3 includes a holder 121. In the holder 121, a plurality of cavities 123 are formed in arrangement corresponding to that of the coaxial probes 51 of the connector 1. In the cavities 123, the coaxial plugs 161 are inserted respectively. Each of the coaxial plugs 161 includes the axial terminal 162 and the surrounding terminal 163 which surrounds the axial terminal 162 and which is arranged coaxial with the axial terminal 162.

FIG. 12 is a view showing a state that the plug 3 is mated with the connector 1 which is attached to the circuit board 2. In this mated state, each of the coaxial plugs 161 of the plug 3 are mated with one of the coaxial probes 51 of the connector 1. Specifically, the axial terminal 162 of each of the coaxial plugs 161 is pushed into the mating portion 55 of one of the center conductors 53. With this, the axial terminal 162 of each of the coaxial plugs 161 is electrically and securely connected to the land 151 of the circuit board 2 via the center terminal 52. Further, the surrounding terminal 163 of each of the coaxial plugs 161 is inserted into a plurality of leaf springs 65 of the mating portion 55 of one of the outer conductors 62 to thereby push the leaf springs 65. With this, the surrounding terminal 163 of the coaxial plug 161 is electrically and securely connected to the land 151 of the circuit board 2 via the outer terminal 61.

As described above, by pressing the housing 11 in the contact state in FIG. 8 against the circuit board 2, the cylindrical contacts 81 is rotated while being pushed into the housing 11 and the connector 1 of this embodiment is attached to the circuit board 2 as shown in FIG. 10. Therefore, the pair of projecting contact points 83 brought contact with the lands 151 of the circuit board 2 in FIG. 8 are rotated on the lands 151 to rub against the lands 151 while the cylindrical contact 81 is moved from the position shown in FIG. 8 at which the cylindrical contact 81 projects from the housing 11 to the position shown in FIG. 10 at which the cylindrical contact 81 is pushed into the housing 11. With this, it is possible to perform the wiping of the pair of projecting contact points 83 and the lands 151.

As described above, in the connector 1 of this embodiment, it is possible to perform the wiping upon attaching the connector 1 to the circuit board 2, even though the terminals of the connector 1 are the coaxial terminals 51. Further, by this wiping, it is possible to rub off or remove the oxide film from the surfaces of the pairs of projecting contact points 83 and the lands 151 and to remove dust caught therebetween, thereby making it possible to prevent the increase in contact resistance between the coaxial terminals 51 and the lands 151.

In addition, since each of the cylindrical contacts 81 is biased toward the lands 151 by the outer coil spring 71, it is possible to bring the pairs of projecting contact points 83 into contact with the lands 151 before the housing 11 is attached to the circuit board 2, to bias the pairs of projecting contact points 83 against the lands 151 by a desired biasing force at the time of the wiping, and to reduce the contact resistance between the pairs of projecting contact points 83 and the lands 151 in the state that the housing 11 is attached to the circuit board 2.

Further, the pair of projecting contact points 83 are arranged of the cylindrical contact 81 at rotationally symmetric positions of the cylindrical shape of the cylindrical contact 81. With this, it is possible to limit or regulate a contact portion, at which the cylindrical contact 81 and the lands 151 are brought into contact with each other, to the pair of projecting contact points 83 and to assuredly bring the cylindrical contact 81 into contact with the lands 151. Further, it is sufficient that the lands 151 are formed on the circuit board 2 at a range in which the pairs of projecting contact points 83 perform the wiping, thereby eliminating any need to form the land 151 in a doughnut shape or the like corresponding to the cylindrical shape of the cylindrical contact 81. Furthermore, it is possible to prevent the cylindrical contacts 81 from erroneously wiping portions other than the lands 151 of the circuit board 2.

Since the terminals of the connector 1 are the coaxial terminals 51, it is possible to prevent crosstalk among the plurality of probes 51. As a result, in the connector 1, it is possible to obtain the performance sufficient for transmitting or transferring high-frequency component of the signal. Accordingly, the connector 1 can be used for connecting a target circuit board having a measurement target mounted thereon to a measuring circuit board having a signal generator circuit, a comparator, etc. mounted thereon, with the coaxial cables and without any soldering.

Note that in this embodiment, although the pair of projecting contact points 83 are formed in each of the cylindrical contacts 81, it is allowable that the number of the projecting contact points 83 is one or not less than three. In a case that the plurality of projecting contact points 83 are formed in the cylindrical contact 81, the plurality of projecting contact points 83 may be provided on the cylindrical contact 81 having the cylindrical shape, in arrangement other than the rotational symmetry.

Figure 13:
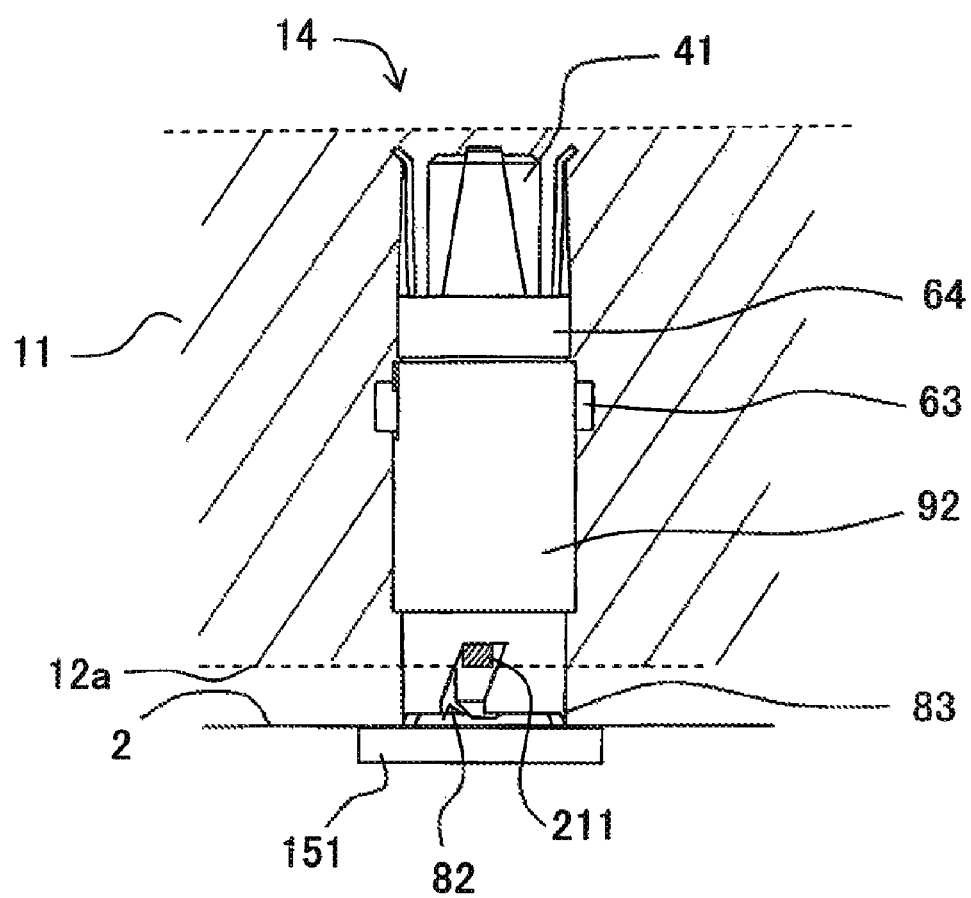
FIG. 13 is an explanatory view showing a state that a connector of a modification is made to abut on the circuit board.
Figure 14:
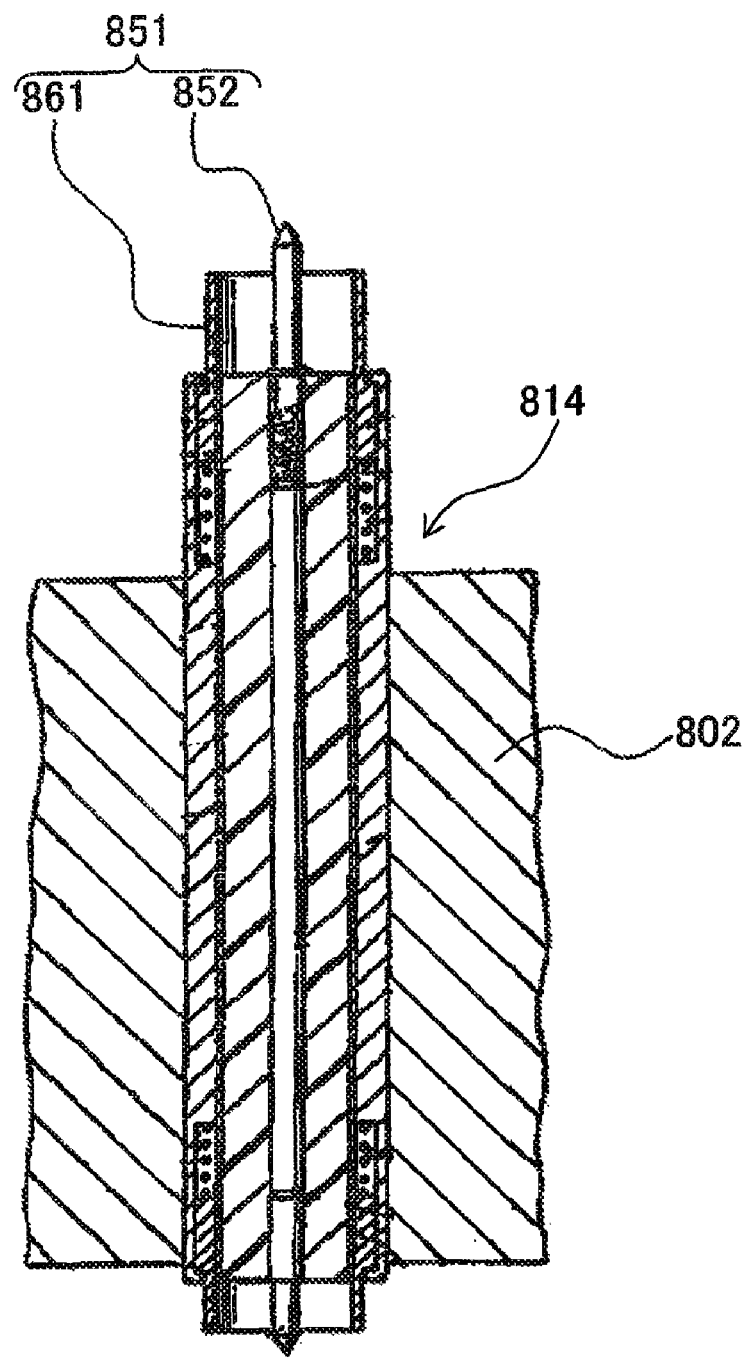
FIG. 14 is a cross-sectional view showing a conventional coaxial movable contact probe.
Figure 15:
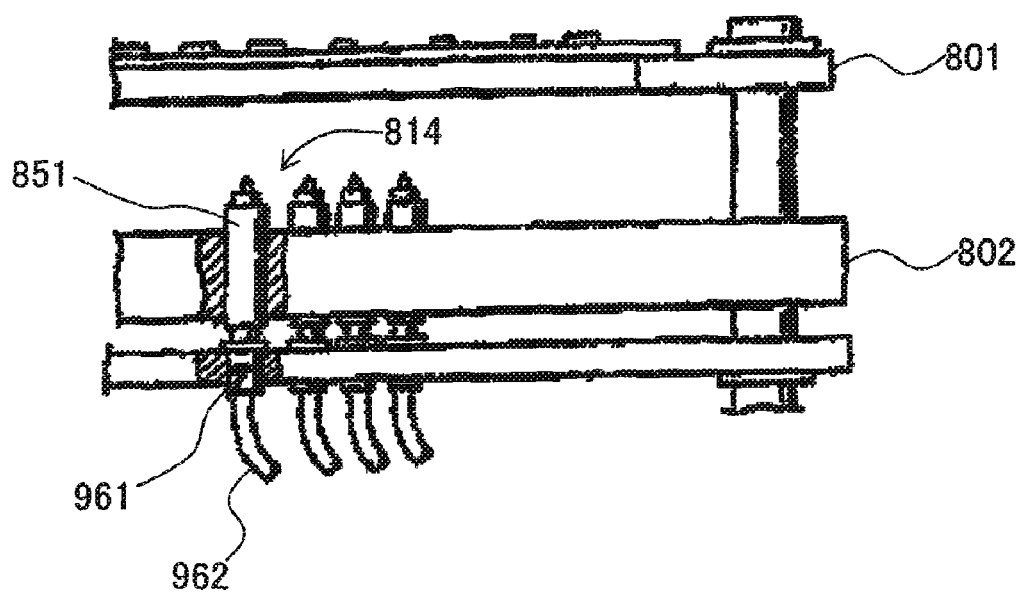
FIG. 15 is a view showing the coaxial movable contact probe shown in FIG. 14 is in use.

In this embodiment, the oblique slits 82 are formed in the cylindrical contact 81, and the guide projections 95 of the conductive arms 94 of the conductive cover 91 (outer terminal 61) are engaged with the oblique slits 82. Alternatively, for example, it is allowable to form oblique grooves which are oblique relative to the axial direction of the cylindrical contact 81, and to engage the conductive arms 94 of the conductive cover 91 (outer terminal 61) with the oblique grooves. Alternatively, it is allowable to form guide projections 211 in the housing 11 as shown in FIG. 13 as a hatched portion, and to engage the guide projections 211 with the oblique slits 82 or oblique grooves. Note that in FIG. 13, the conductive arms 94 are not provided in the conductive cover 91, and that instead of the conductive arms 94, the guide projections 211 project toward the inside of the cavity 14 of the housing 11, each of the guide projections 211 having a length large enough to be engaged with one of the oblique slits 82 of the cylindrical contact 81.

Further, in this embodiment, the outer coil spring 71 is used to generate the force which acts on the cylindrical contact 81 such that the cylindrical contact 81 is projected from the housing 11. Alternatively, for example, the biasing force may be generated by using a leaf spring or the like to act on the cylindrical contact 81. Furthermore, the leaf spring may be formed as a leaf spring structure as a part of the housing 11.

The coaxial connector of the present invention can perform the wiping by rotating the cylindrical contacts brought into contact with the lands of the circuit board, upon attaching the coaxial connector to the circuit board. Therefore, it is possible to electrically connect the cylindrical contacts and the lands of the circuit board with a low contact resistance. Accordingly, the coaxial connector of the present invention can be used for connecting a target circuit board having a measurement target mounted thereon to a measuring circuit board having a signal generator circuit, a comparator, etc. mounted thereon, with the coaxial cables.

What is claimed is:

1. A coaxial connector which is attached to a circuit board having a land, comprising:
    a coaxial terminal which has a coaxial structure including a center terminal and a cylindrical outer terminal surrounding the center terminal;
    a housing which accommodates the coaxial terminal; and
    a cylindrical contact which is movable in an axial direction of the outer terminal and which is brought into contact with the land;
    wherein an oblique slit or groove is formed on the cylindrical contact obliquely with respect to the axial direction; and
    the coaxial terminal or the housing is provided with a projection which is engaged with the oblique slit or groove.

2. The coaxial connector according to claim 1, further comprising a biasing member which biases the cylindrical contact so that the cylindrical contact projects from the housing.

3. The coaxial connector according to claim 1, wherein the cylindrical contact has a plurality of projecting contact points which are arranged on the cylindrical contact at rotationally symmetric positions of a cylindrical shape of the cylindrical contact to project from the cylindrical contact and which are brought into contact with the land.

4. The coaxial connector according to claim 1, wherein the oblique slit is formed in the cylindrical contact; and
    the coaxial connector further comprises:
        a conductive cover having a conductive cover-body which is formed in a cylindrical shape and into which the cylindrical contact is inserted; and
        a conductive arm which projects from the conductive cover-body and which is bent inwardly and functions as the projection when the conductive arm is engaged with the oblique slit.

* * * * *